(12) United States Patent
Chang et al.

(10) Patent No.: US 12,432,944 B2
(45) Date of Patent: Sep. 30, 2025

(54) SEMICONDUCTOR DEVICE STRUCTURE AND METHOD FOR FORMING SAME

(71) Applicant: CANSEMI TECHNOLOGY INC., Guangzhou (CN)

(72) Inventors: Yohtz Julian Chang, Guangzhou (CN); Yunbo Chen, Guangzhou (CN); Canyang Huang, Guangzhou (CN); Zeyong Chen, Guangzhou (CN)

(73) Assignee: CANSEMI TECHNOLOGY INC., Guangzhou (CN)

( * ) Notice: Subject to any disclaimer, the term of this patent is extended or adjusted under 35 U.S.C. 154(b) by 0 days.

(21) Appl. No.: 18/579,269

(22) PCT Filed: Jan. 29, 2022

(86) PCT No.: PCT/CN2022/075072
§ 371 (c)(1),
(2) Date: Jan. 12, 2024

(87) PCT Pub. No.: WO2023/284289
PCT Pub. Date: Jan. 19, 2023

(65) Prior Publication Data
US 2024/0332395 A1   Oct. 3, 2024

(30) Foreign Application Priority Data
Jul. 12, 2021 (CN) .......................... 202110781840.6

(51) Int. Cl.
*H10D 1/00* (2025.01)
*H10D 1/66* (2025.01)
*H10D 89/10* (2025.01)

(52) U.S. Cl.
CPC ............... *H10D 1/047* (2025.01); *H10D 1/66* (2025.01); *H10D 89/10* (2025.01)

(58) Field of Classification Search
CPC ........ H10D 1/041; H10D 1/042; H10D 1/043; H10D 1/047; H10D 1/66; H10D 1/692;
(Continued)

(56) References Cited

U.S. PATENT DOCUMENTS 5,573,963 A * 11/1996 Sung .................... H10D 84/038
257/E21.644
8,193,576 B2 * 6/2012 Ko ....................... H10D 62/126
438/266

(Continued)

FOREIGN PATENT DOCUMENTS

CN        1841740 A     10/2006
CN      101276846 A     10/2008
(Continued)

*Primary Examiner* — Natalia A Gondarenko
(74) *Attorney, Agent, or Firm* — MUNCY, GEISSLER, OLDS & LOWE, P.C.

(57) ABSTRACT

A semiconductor device structure and a method of forming the structure are disclosed. The semiconductor device structure includes a first capacitor and a second capacitor. The first capacitor is formed in a first redundant area, and the second capacitor is formed in a second redundant area. Since the first and second capacitors are formed in the respective redundant areas of the substrate, they will not unnecessarily occupy portions of a device area.

11 Claims, 3 Drawing Sheets

(58) Field of Classification Search
CPC ...... H10D 1/714; H10D 89/013; H10D 89/10;
H10D 84/01; H10D 84/0126; H10D
84/0135; H10D 84/0144; H10D 84/0151;
H10D 84/0156; H10D 84/0165; H10D
84/0172; H10D 84/0181; H10D 84/0188;
H10D 84/0191; H10D 84/204; H10D
84/212; H01L 21/02373; H01L 21/02381;
H01L 21/0415; H01L 21/046; H01L
21/044; H01L 21/0465; H01L 21/425;
H01L 21/2253; H01L 21/2652
USPC ....... 257/296, 532, 777, 724, 659, 686, 666,
257/668, 676, 916, 691
See application file for complete search history.

(56) References Cited

U.S. PATENT DOCUMENTS

| | | | |
|---|---|---|---|
| 2003/0071315 A1* | 4/2003 | Peng | H10B 20/00 257/E29.345 |
| 2004/0256658 A1 | 12/2004 | Park et al. | |
| 2005/0280095 A1 | 12/2005 | Nabatame et al. | |
| 2008/0237673 A1* | 10/2008 | Wada | G11C 5/145 257/E29.345 |
| 2012/0037971 A1* | 2/2012 | Kwon | H10D 1/66 257/E29.345 |
| 2012/0043595 A1* | 2/2012 | Chang | H10D 1/66 257/E29.345 |
| 2013/0020654 A1 | 1/2013 | Yamada et al. | |
| 2015/0162323 A1* | 6/2015 | Taya | H10D 30/0212 257/296 |

FOREIGN PATENT DOCUMENTS

| | | |
|---|---|---|
| CN | 103199092 A | 7/2013 |
| CN | 107039535 A | 8/2017 |
| CN | 108242443 A | 7/2018 |
| CN | 108269861 A | 7/2018 |
| CN | 108305830 A | 7/2018 |
| CN | 109037195 A | 12/2018 |
| CN | 111430328 A | 7/2020 |
| CN | 113078159 A | 7/2021 |
| CN | 113241345 A | 8/2021 |

* cited by examiner

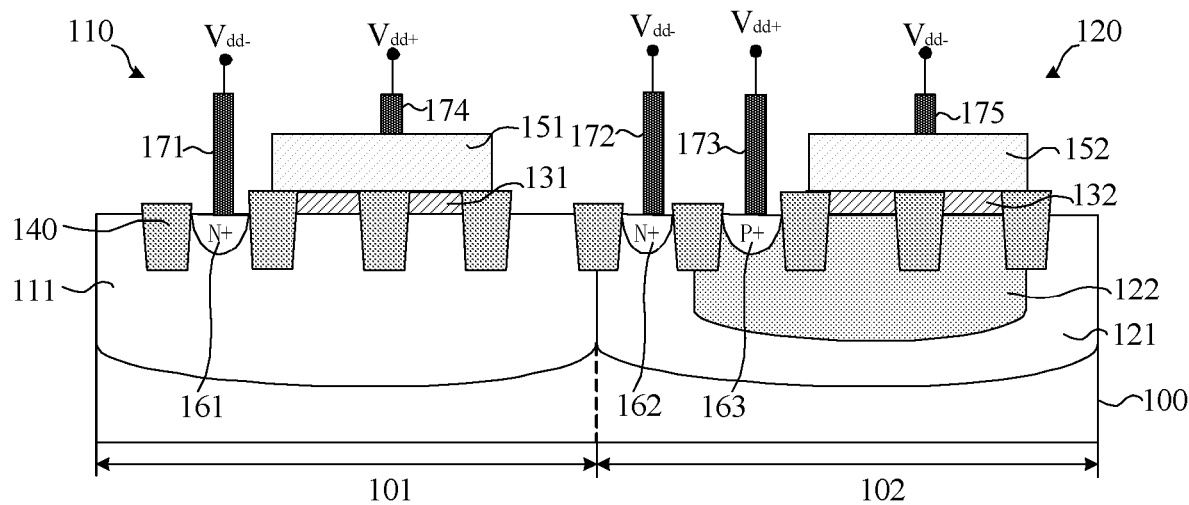
Fig. 1
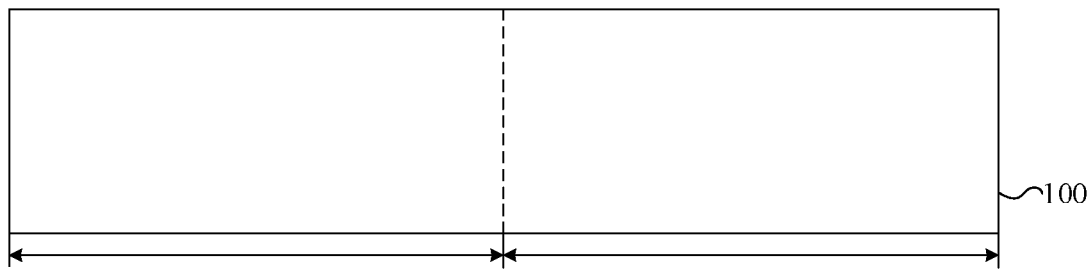
Fig. 2
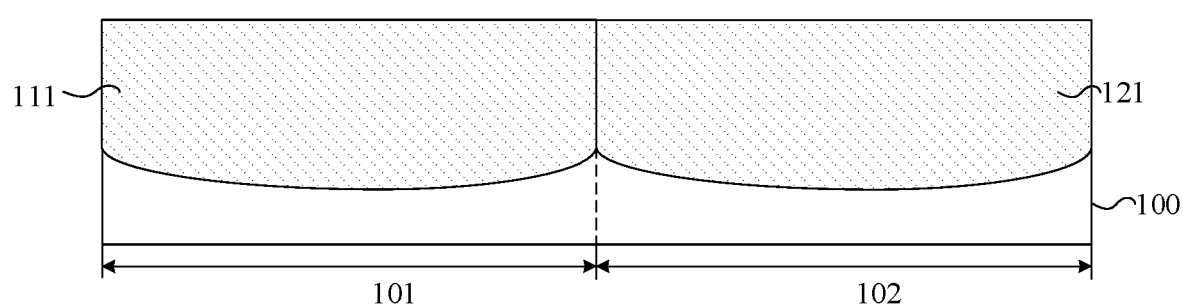
Fig. 3
Fig. 4

SEMICONDUCTOR DEVICE STRUCTURE AND METHOD FOR FORMING SAME

TECHNICAL FIELD

The present invention relates to the fabrication of semiconductor devices and, in particular, to a semiconductor device structure and a method of forming the structure.

BACKGROUND

Capacitors are important components of integrated circuits and are widely used in memory, microwave, radio frequency, smart card, high voltage, filtering and other chips. Capacitors commonly used in metal-oxide-semiconductor (MOS) devices typically include metal-oxide-metal (MOM), metal-insulator-metal (MIM) and polysilicon-insulator-polysilicon (PIP) ones. However, these capacitors are associated with the problem that they are usually formed in a device area of a substrate and therefore must be separated from adjacent components, leading to unnecessary occupation of the device area.

SUMMARY OF THE INVENTION

It is an objective of the present invention to provide a semiconductor device structure and a method of forming the structure, which can overcome the problem of unnecessary occupation of a device area.

To this end, the present invention provides a semiconductor device structure including:
  a substrate having a first redundant area and a second redundant area;
  a first capacitor formed in the first redundant area, the first capacitor including a first well region of a first conductivity type, a first dummy gate of a second conductivity type and a first gate dielectric layer formed between the first well region of the first conductivity type and the first dummy gate of the second conductivity type, the first well region formed in the first redundant area of the substrate, the first dummy gate formed on the first well region, the first well region serving as a negative plate of the first capacitor, the first dummy gate serving as a positive plate of the first capacitor;
  a second capacitor formed in the second redundant area, the second capacitor including a second well region of the first conductivity type, a third well region of the second conductivity type, a second dummy gate of the first conductivity type and a second gate dielectric layer formed between the third well region of the second conductivity type and the second dummy gate of the first conductivity type, the second well region formed in the second redundant area of the substrate, the third well region formed in the second well region, the second dummy gate formed on the third well region, the third well region serving as a positive plate of the second capacitor, the second dummy gate serving as a negative plate of the second capacitor;
  a first doped region of the first conductivity type, a second doped region of the first conductivity type and a third doped region of the second conductivity type, the first doped region formed in the first well region, the second doped region formed in the second well region and the third doped region formed in the third well region; and
  a first contact plug, a second contact plug and a third contact plug, the first contact plug aligned with the first doped region, the second contact plug aligned with the second doped region and the third contact plug aligned with the third doped region.

Optionally, in the semiconductor device structure, the first conductivity type may be n-type and the second conductivity type may be p-type.

Optionally, in the semiconductor device structure, the first dummy gate may be made of n+ doped polysilicon and the second dummy gate may be made of p+ doped polysilicon.

Optionally, in the semiconductor device structure, the positive plates of the first and second capacitors may be configured for connection with a positive voltage rail and the negative plates of the first and second capacitors may be configured for connection with a negative voltage rail.

Optionally, the semiconductor device structure may further include a fourth contact plug formed on the first dummy gate and a fifth contact plug formed on the second dummy gate.

Optionally, the first to fifth contact plugs may be all made of tungsten.

Optionally, the substrate may be made of silicon germanium.

Based on the same inventive concept, the present invention also provides a method of forming a semiconductor device structure, which includes:
  providing a substrate having a first redundant area and a second redundant area;
  forming a first capacitor and a second capacitor, the first capacitor formed in the first redundant area, the first capacitor including a first well region of a first conductivity type, a first dummy gate of a second conductivity type and a first gate dielectric layer formed between the first well region of the first conductivity type and the first dummy gate of the second conductivity type, the first well region formed in the first redundant area of the substrate, the first dummy gate formed on the first well region, the first well region serving as a negative plate of the first capacitor, the first dummy gate serving as a positive plate of the first capacitor, the second capacitor formed in the second redundant area, the second capacitor including a second well region of the first conductivity type, a third well region of the second conductivity type, a second dummy gate of the first conductivity type and a second gate dielectric layer formed between the third well region of the second conductivity type and the second dummy gate of the first conductivity type, the second well region formed in the second redundant area of the substrate, the third well region formed in the second well region, the second dummy gate formed on the third well region, the third well region serving as a positive plate of the second capacitor, the second dummy gate serving as a negative plate of the second capacitor;
  forming a first doped region and a second doped region of the first conductivity type, the first doped region is formed in the first well region and the second doped region is formed in the second well region;
  forming a third doped region of the second conductivity type in the third well region; and
  forming a first contact plug, a second contact plug and a third contact plug, the first contact plug aligned with the first doped region, the second contact plug aligned with the second doped region and the third contact plug aligned with the third doped region.

Optionally, in the method, both the first and second well regions may be formed using a first ion implantation process in which ions of the first conductivity type are implanted at a concentration in the range of from $1E15/cm^2$ to $15E15/cm^2$.

Optionally, in the method, the third well region may be formed using a second ion implantation process in which ions of the second conductivity type are implanted at a concentration in the range of from $1E15/cm^2$ to $15E15/cm^2$.

Optionally, in the method, the step of forming the first, second and third contact plugs may further include:

forming a fourth contact plug on the first dummy gate and a fifth contact plug on the second dummy gate.

The present invention provides a semiconductor device structure and a method of forming the structure. The semiconductor device structure includes a first capacitor and a second capacitor. The first capacitor is formed in a first redundant area, and the second capacitor is formed in a second redundant area, of a substrate. Since the capacitors are formed in the redundant areas of the substrate, they will not unnecessarily occupy portions of a device area.

BRIEF DESCRIPTION OF THE DRAWINGS

FIG. 1 is a schematic cross-sectional view of a semiconductor device structure according to an embodiment of the present invention.

FIG. 2 schematically illustrates a method of forming a semiconductor device structure according to an embodiment of the present invention.

FIGS. 3 to 10 are schematic cross-sectional views of steps resulting from steps in a method of forming a semiconductor device structure according to an embodiment of the present invention.

Figure 5:
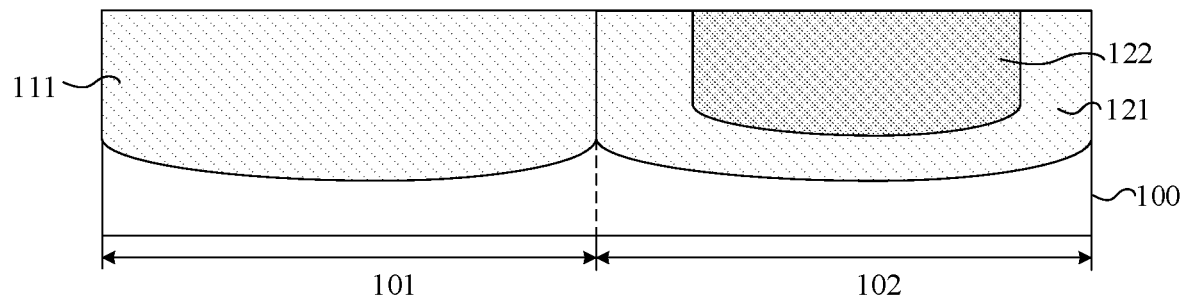

In these figures: 100—substrate; 101—first redundant area; 102—second redundant area; 110—first capacitor; 111—first well region; 120—second capacitor; 121—second well region; 122—third well region; 130—gate dielectric layer; 131—first gate dielectric layer; 132—second gate dielectric layer; 140—STI structure; 150—dummy gate material layer; 151—first dummy gate; 152—second dummy gate; 161—first doped region; 162—second doped region; 163—third doped region; 171—first contact plug; 172—second contact plug; 173—third contact plug; 174—fourth contact plug; 175—fifth contact plug.

DETAILED DESCRIPTION

Semiconductor device structures and methods of formation proposed in the present invention will be described in greater detail below with reference to a few embodiments and the accompanying drawings. From the following description, advantages and features of the invention will become more apparent. Note that the figures are provided in a very simplified form not necessarily drawn to exact scale and for the only purpose of facilitating easy and clear description of the disclosed embodiments.

FIG. 1 is a schematic cross-sectional view of a semiconductor device structure according to an embodiment of the present invention. As shown in FIG. 1, the semiconductor device structure includes a substrate 100, a first capacitor 110 and a second capacitor 120.

The substrate 100 has a first redundant area 101 and a second redundant area 102. Here, the first redundant area 101 and the second redundant area 102 are so called in contrast to a device area for formation of transistors and other devices therein.

The first capacitor 110 is formed in the first redundant area 101, avoiding unnecessary occupation of a device area. The first capacitor 110 includes a first well region 111 of a first conductivity type and a first dummy gate 151 of a second conductivity type. The first well region 111 is formed in the first redundant area 101 of the substrate 100, and the first dummy gate 151 is formed on the first well region 111. The first dummy gate 151 may serve as a positive plate of the first capacitor 110, and the first well region 111 may serve as a negative plate of the first capacitor 110. The negative plate of the first capacitor 110 is configured for connection with a negative voltage rail, and the positive plate of the first capacitor 110 is configured for connection with a positive voltage rail.

The second capacitor 120 is formed in the second redundant area 102, avoiding unnecessary occupation of a device area. The second capacitor 120 includes a second well region 121 of the first conductivity type, a third well region 122 of the second conductivity type, a second dummy gate 152 of the first conductivity type and a second gate dielectric layer 132 formed between the third well region 122 of the second conductivity type and the second dummy gate 152 of the first conductivity type. The second well region 121 is formed in the second redundant area 102 of the substrate 100, third well region 122 is formed in the second well region 121, and the second dummy gate 152 is formed on the third well region 122. The second dummy gate 152 may serve as a negative plate of the second capacitor, and the third well region 122 may serve as a positive plate of the second capacitor. The positive plate of the second capacitor is configured for connection with a positive voltage rail, and the negative plate of the second capacitor is configured for connection with a negative voltage rail.

The semiconductor device structure further includes a first doped region 161 of the first conductivity type, a second doped region 162 of the first conductivity type and a third doped region 163 of the second conductivity type. The first doped region 161 is formed in the first well region 111, the second doped region 162 is formed in the second well region 121 and the third doped region 163 is formed in the third well region 122. Each of the first doped region 161, the second doped region 162 and the third doped region 163 may constitute a virtual source region or a virtual drain region of the semiconductor device structure.

The semiconductor device further includes contact plugs, the contact plugs include a first contact plug 171, a second contact plug 172, a third contact plug 173, a fourth contact plug 174 and a fifth contact plug 175. The first contact plug 171 is aligned with the first doped region 161 and is electrically connected to the first well region 111 through the first doped region 161. The second contact plug 172 is aligned with the second doped region 162 and is electrically connected to the second well region 121 through the second doped region 162. The third contact plug 173 is aligned with the third doped region 163 and is electrically connected to the third well region 122 through the third doped region 163. The fourth contact plug 174 is formed on the first dummy gate 151 so that the first dummy gate 151 can be electrically connected to an external circuit through the fourth contact plug 174. The fifth contact plug 175 is formed on the second dummy gate 152 so that the second dummy gate 152 can be electrically connected to an external circuit through the fifth contact plug 175. Each of the first contact plug 171, the second contact plug 172, the third contact plug 173, the fourth contact plug 174 and the fifth contact plug 175 may be made of a metal such as copper, tungsten or aluminum.

In this embodiment, the first conductivity type is n-type, and the second conductivity type is p-type. Preferably, the first doped region 161 is an n+ doped region, which ensures robust electrical connection and signal transmission between the first contact plug 171 and the first well region 111. The second doped region 162 is an n+ doped region, which ensures robust electrical connection and signal transmission between the second contact plug 172 and the second well region 121. The third doped region 163 is a p+ doped region, which ensures robust electrical connection and signal transmission between the third contact plug 173 and the third well region 122.

FIG. 2 schematically illustrates a method of forming a semiconductor device structure according to an embodiment of the present invention. The method is based on the same inventive concept as the semiconductor device structure as defined above. As shown in FIG. 2, the method of forming a semiconductor device structure includes the steps as follows:

Step S1: Provide a substrate having a first redundant area and a second redundant area.

Step S2: Forming a first capacitor and a second capacitor. The first capacitor is formed in the first redundant area, and the second capacitor is formed in the second redundant area. The first capacitor includes a first well region of a first conductivity type, a first dummy gate of a second conductivity type and a first gate dielectric layer formed between the first well region of the first conductivity type and the first dummy gate of the second conductivity type. The first well region is formed in the first redundant area of the substrate, and the first dummy gate is formed on the first well region.

The second capacitor includes a second well region of the first conductivity type, a third well region of the second conductivity type, a second dummy gate of the first conductivity type and a second gate dielectric layer formed between the third well region of the second conductivity type and the second dummy gate of the first conductivity type. The second well region is formed in the second redundant area of the substrate, the third well region is formed in the second well region and the second dummy gate is formed on the third well region.

FIGS. 3 to 10 are schematic cross-sectional views of steps resulting from steps in a method of forming a semiconductor device structure according to an embodiment of the present invention. The method of forming a semiconductor device structure will be explained in greater detail below with reference to FIGS. 3 to 10.

First of all, in step S1, referring to FIG. 3, a substrate 100 is provided, the substrate 100 has a first redundant area 101 and a second redundant area 102. The substrate 100 may be of a conductivity type that is p-type. The substrate 100 may be made of, for example, germanium, silicon germanium, silicon carbide, gallium arsenide, indium gallium or the like. In other embodiments, the substrate 100 may be a silicon-on-insulator (SOI) or germanium-on-insulator (GOI) substrate.

The substrate 100 further includes a device area for formation of semiconductor devices such as metal-oxide-semiconductor (MOS) field-effect transistors (FETs) therein. Description of the device area, as well as depiction thereof in FIGS. 3 to 10, is not presented herein in order to avoid unnecessarily obscuring aspects of the present invention.

Next, in step S2, referring to FIGS. 4 to 10, a first capacitor 110 and a second capacitor 120 are formed. The first capacitor 110 is formed in the first redundant area 101, and the second capacitor 120 is formed in the second redundant area 102. The first capacitor 110 includes a first well region 111 of a first conductivity type, a first dummy gate 151 of a second conductivity type and a first gate dielectric layer 131 formed between the first well region 111 of the first conductivity type and the first dummy gate 151 of the second conductivity type. The first well region 111 is formed in the first redundant area 101 of the substrate 100, and the first dummy gate 151 is formed on the first well region 111. The first dummy gate 151 may serve as a positive plate of the first capacitor 110, and the first well region 111 may serve as a negative plate of the first capacitor 110. The negative plate of the first capacitor 110 is configured for connection with a negative voltage rail, and the positive plate of the first capacitor 110 is configured for connection with a positive voltage rail.

The second capacitor 120 includes a second well region 121 of the first conductivity type, a third well region 122 of the second conductivity type, a second dummy gate 152 of the first conductivity type and a second gate dielectric layer 132 formed between the third well region 122 of the second conductivity type and the second dummy gate 152 of the first conductivity type. The second well region 121 is formed in the second redundant area 102 of the substrate 100, the third well region 122 is formed in the second well region 121, and the second dummy gate 152 is formed on the third well region 122. The second dummy gate 152 may serve as a negative plate of the second capacitor 120, and the third well region 122 may serve as a positive plate of the second capacitor 120. The positive plate of the second capacitor 120 is configured for connection with a positive voltage rail, and the negative plate of the second capacitor 120 is configured for connection with a negative voltage rail.

In this embodiment, the first gate dielectric layer 131 may be made of silicon oxide and serve to separate the first well region 111 from the first dummy gate 151. The second gate dielectric layer 132 may be made of silicon oxide and serve to separate the second well region 121 from the second dummy gate 152.

Since the first capacitor 110 is formed in the first redundant area 101 and the second capacitor 120 is formed in the second redundant area 102, they will not unnecessarily occupy portions of the device area. Moreover, since the first capacitor 110 is formed in the first redundant area 101 and the second capacitor 120 is formed in the second redundant area 102, a potential at the first dummy gate 151 or the second dummy gate 152 tends to not vary with variation of resistance of the device area or with variation of the effect of an electric field created by the external circuit on a potential of the device area. Therefore, a potential of the first redundant area 101 or the second redundant area 102 tends to not vary with variation of the resistance or potential of the device area. Thus, the first capacitor 110 and the second capacitor 120 tend to not be affected by said variation, thereby ensuring accurate capacitance of the semiconductor device structure and hence improving its performance.

Specifically, the formation of the first capacitor 110 and the second capacitor 120 may include the steps as follows:

At first, as shown in FIG. 4, the first well region 111 is formed in the first redundant area 101 and the second well region 121 is formed in the second redundant area 102, of the substrate 100. Both the first well region 111 and the second well region 121 are formed using a first ion implantation process involving implanting ions of the first conductivity type, such as arsenic, phosphorus or antimony ions, so that the first well region 111 and the second well region 121 are both of the first conductivity type. In the first ion implantation process, the ions are implanted at a concentration of, for example, in the range of $1E15/cm^2$-$15E15/cm^2$.

Next, as shown in FIG. 5, the third well region 122 is formed in the second well region 121. The third well region 122 is formed using a second ion implantation process involving implanting ions of the second conductivity type, such as boron or indium ions, so that the third well region 122 is of the second conductivity. In the second ion implantation process, the ions are implanted at a concentration of, for example, in the range of 1E15/cm²-15E15/cm².

Specifically, the formation of the third well region 122 may include: first forming a mask layer, which may be a patterned photoresist layer covering the first well region 111; then performing the second ion implantation process to form the third well region 122 in the second well region 121; and removing the mask layer using an ashing or stripping process.

Figure 6:
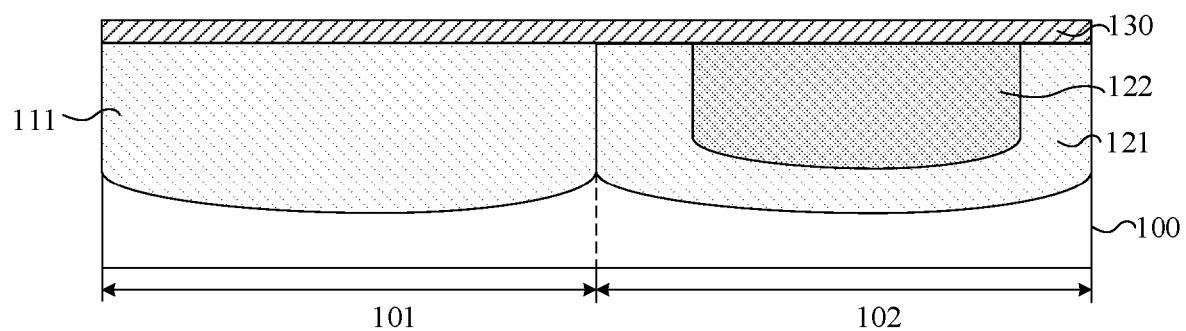

Subsequently, as shown in FIG. 6, a gate dielectric layer 130 is formed, the gate dielectric layer 130 covers the substrate 100. The gate dielectric layer 130 may be made of silicon oxide, for example. The gate dielectric layer 130 may be formed using a thermal oxidation process. The thermal oxidation process may be performed at a temperature in the range of 1000-2000° C., such as 1000° C., 1500° C. or 2000° C. The gate dielectric layer 130 may have a thickness of, for example, 100-500 Å.

Figure 7:
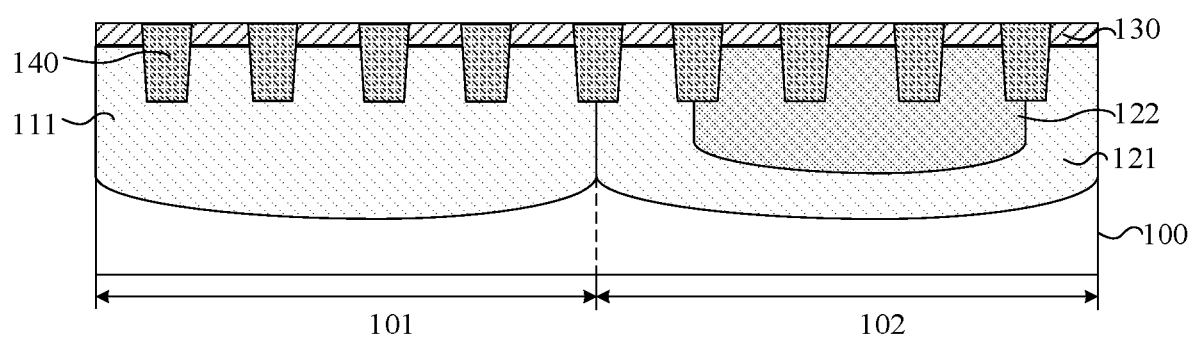

Afterwards, as shown in FIG. 7, a shallow trench isolation (STI) structure 140 is formed, the STI structure 140 extends through the gate dielectric layer 130 into the substrate 100 so as to define a virtual active area in the substrate 100.

Figure 8:
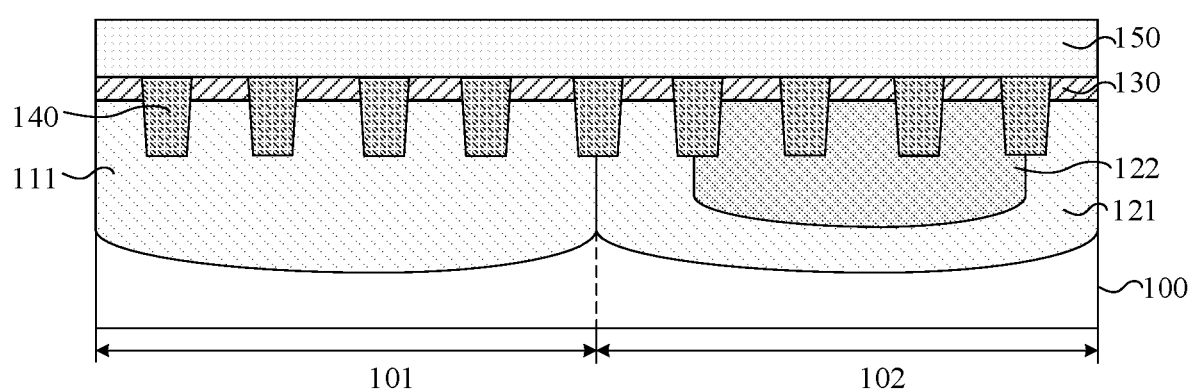

Thereafter, as shown in FIG. 8, a dummy gate material layer 150 is formed, the dummy gate material layer 150 covers both the gate dielectric layer 130 and the STI structure 140. Specifically, the dummy gate material layer 150 may be formed of polysilicon, the dummy gate material layer 150 may be formed by using a chemical vapor deposition (CVD) process such as a low-pressure CVD process.

Figure 9:
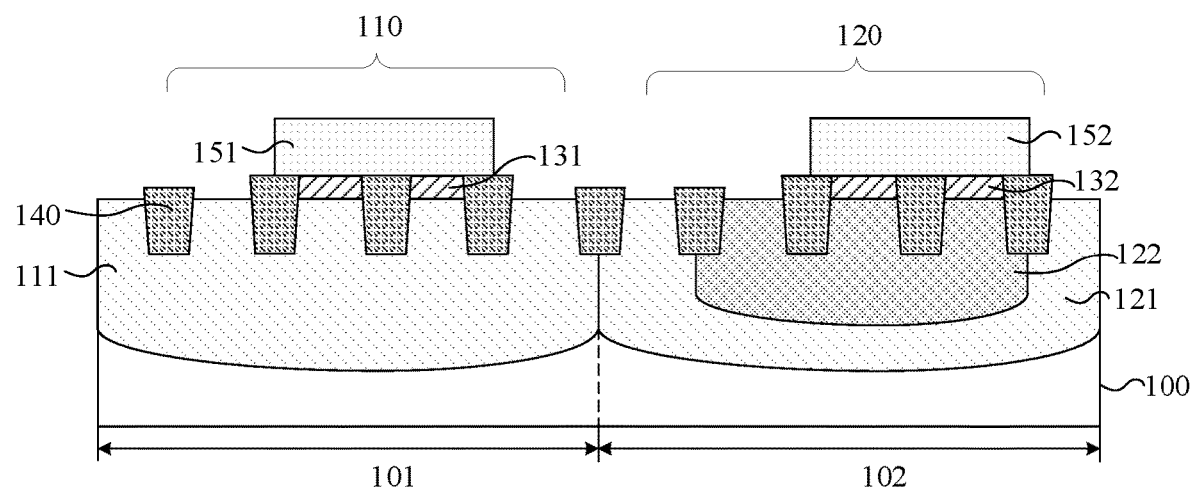

As shown in FIG. 9, the dummy gate material layer 150 is then etched, resulting in the formation of the first dummy gate 151 and the second dummy gate 152. Moreover, the exposed gate dielectric layer 130 is further etched, resulting in the formation of the first gate dielectric layer 131 and the second gate dielectric layer 132.

Further, during etching of the gate dielectric layer 130, a partially thickness of the STI structure 140 may be etched away.

Figure 10:
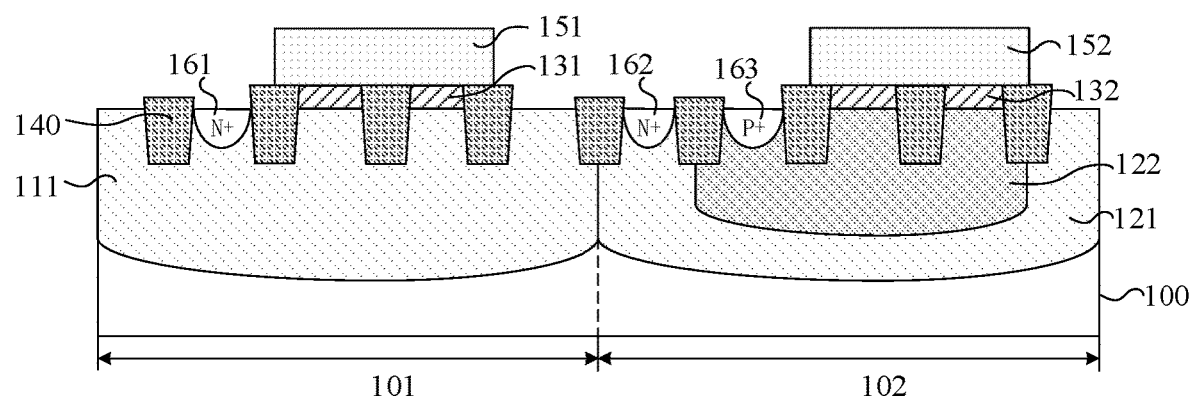

After that, as shown in FIG. 10, the first doped region 161 of the first conductivity type and the second doped region 162 are formed. The first doped region 161 is formed in the first well region 111, and the second doped region 162 is formed in the second well region 121. Specifically, a first ion implantation process may be carried out, in which dopant ions are implanted to the second dummy gate 152, resulting in the formation of the first doped region 161 of the first conductivity type in the first well region 111 and the second doped region 162 of the second conductivity type in the second well region 121.

More specifically, in the first ion implantation process, dopant ions of the first conductivity type are implanted so that the conductivity type of the second dummy gate 152 is opposite to that of the third well region 122. In this way, when a positive bias voltage is applied to the second capacitor 120 (by connecting the second dummy gate 152 to the negative voltage rail, the third well region 122 to the positive voltage rail and the second well region 121 to the negative voltage rail), a layer of holes will build up between the third well region 122 and the second gate dielectric layer 132, which can result in a thinner depletion layer and hence increase capacitance of the second capacitor 110.

Next, referring to FIG. 10, a third doped region 163 of the second conductivity type is formed, the third doped region 163 is formed in the third well region 122. This may involve carrying out a second ion implantation process involving implanting ions to the first dummy gate 151 and thereby forming the third doped region 163 of the second conductivity type in the third well region 122. Specifically, in the second ion implantation process, dopant ions of the second conductivity type may be implanted to the first dummy gate 151 so that the conductivity type of the first dummy gate 151 is opposite to that of the first well region 111. As a result, when a positive bias voltage is applied to the first capacitor 110 (by connecting the first dummy gate 151 to the positive voltage rail and the first well region 111 to the negative voltage rail), a layer of electrons will build up between the first well region 111 and the first gate dielectric layer 131, which can result in a thinner depletion layer and hence increase capacitance of the first capacitor 110.

In this embodiment, the first conductivity type may be p-type, and the second conductivity type may be n-type.

Preferably, the first ion implantation process may be an n+ doping process so that the both the first doped region 161 and the second doped region 162 are n+ doped regions, which can ensure robust electrical connection and signal transmission between the subsequently-formed first contact plug and the first well region 111 and robust electrical connection and signal transmission between the subsequently-formed second contact plug and the second well region 121.

Preferably, the second ion implantation process may be a p+ doping process so that the third doped region 163 is a p+ doped region, which can ensure robust electrical connection and signal transmission between the subsequently-formed third contact plug and the third well region 122.

After the second implantation process, a thermal annealing process may be carried out to additionally activate the dopant ions in the first doped region 161, the second doped region 162 and the third doped region 163 so that the they can diffuse and be more uniformly distributed across the first doped region 161, the second doped region 162 and the third doped region 163. The thermal annealing process may be performed at a temperature of, for example, 900-1100° C.

After that, with continued reference to FIG. 1, contact plugs are formed, the contact plugs include a first contact plug 171, a second contact plug 172, a third contact plug 173, a fourth contact plug 174 and a fifth contact plug 175. The first contact plug 171 is aligned with the first doped region 161 and is electrically connected to the first well region 111 through the first doped region 161. In this way, the first doped region 161 and the first well region 111 (i.e., the negative plate of the first capacitor) are connected to the negative voltage rail through the first contact plug 171.

The second contact plug 172 is aligned with the second doped region 162 and is electrically connected to the second well region 121 through the second doped region 162. In this way, the second doped region 162 and the second well region 121 are connected to the negative voltage rail through the second contact plug 172.

The third contact plug 173 is aligned with the third doped region 163 and is electrically connected to the third well region 122 through the third doped region 163. In this way, the third doped region 163 and the third well region 122 (i.e., the positive plate of the second capacitor) are connected to the positive voltage rail through the third contact plug 173.

The fourth contact plug 174 is formed on the first dummy gate 151 so that the first dummy gate 151 can be electrically connected to an external circuit through the fourth contact plug 174. Moreover, the first dummy gate 151 (i.e., the positive plate of the first capacitor) can be connected to the positive voltage rail through the fourth contact plug 174.

The fifth contact plug 175 is formed on the second dummy gate 152 so that the second dummy gate 152 can be electrically connected to an external circuit through the fifth contact plug 175. Moreover, the second dummy gate 152 (i.e., the negative plate of the second capacitor) can be connected to the negative voltage rail through the fifth contact plug 175.

In summary, the present invention provides a semiconductor device structure and a method of forming the structure. The semiconductor device structure includes a first capacitor and a second capacitor. The first capacitor is formed in a first redundant area, and the second capacitor is formed in a second redundant area, of a substrate. Since the capacitors are formed in the redundant areas of the substrate, they will not unnecessarily occupy portions of a device area.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A semiconductor device structure, comprising:
   a substrate having a first redundant area and a second redundant area, wherein the substrate is made of silicon germanium;
   a first capacitor formed in the first redundant area, the first capacitor comprising a first well region of a first conductivity type, a first dummy gate of a second conductivity type and a first gate dielectric layer formed between the first well region of the first conductivity type and the first dummy gate of the second conductivity type, the first well region formed in the first redundant area of the substrate, the first dummy gate formed on the first well region, the first well region serving as a negative plate of the first capacitor, the first dummy gate serving as a positive plate of the first capacitor;
   a second capacitor formed in the second redundant area, the second capacitor comprising a second well region of the first conductivity type, a third well region of the second conductivity type, a second dummy gate of the first conductivity type and a second gate dielectric layer formed between the third well region of the second conductivity type and the second dummy gate of the first conductivity type, the second well region formed in the second redundant area of the substrate, the third well region formed in the second well region, the second dummy gate formed on the third well region, the third well region serving as a positive plate of the second capacitor, the second dummy gate serving as a negative plate of the second capacitor;
   a first doped region of the first conductivity type, a second doped region of the first conductivity type and a third doped region of the second conductivity type, the first doped region formed in the first well region, the second doped region formed in the second well region and the third doped region formed in the third well region;
   contact plugs comprising a first contact plug, a second contact plug, a third contact plug, a fourth contact plug and a fifth contact plug, the first contact plug aligned with the first doped region, the second contact plug aligned with the second doped region, the third contact plug aligned with the third doped region, the fourth contact plug is formed on the first dummy gate and the fifth contact plug is formed on the second dummy gate, the first contact plug, the second contact plug, the third contact plug, the fourth contact plug and the fifth contact plug are all made of tungsten, and
   a shallow trench isolation (STI) structure, the STI structure has a top surface flush with a bottom surface of the first dummy gate and the second dummy gate, extends through the first gate dielectric layer and the second gate dielectric layer into the first well region and the second well region so as to define a virtual active area in the substrate, wherein the top surface of the STI structure is in direct connection with the bottom surface of the first dummy gate and the second dummy gate, and the first dummy gate and the second dummy gate are not in contact with each other,
   wherein the first conductivity type is n-type and the second conductivity type is p-type, the first dummy gate is made of p+ doped polysilicon and the second dummy gate is made of n+ doped polysilicon; the positive plate of the first capacitor and the positive plate of the second capacitor are configured for connection with a positive voltage rail and the negative plate of the first capacitor and the negative plate of the second capacitor are configured for connection with a negative voltage rail.

2. A method of forming a semiconductor device structure, comprising:
   providing a substrate having a first redundant area and a second redundant area, wherein the substrate is made of silicon germanium;
   forming a first capacitor and a second capacitor, the first capacitor formed in the first redundant area, the first capacitor comprising a first well region of a first conductivity type, a first dummy gate of a second conductivity type and a first gate dielectric layer formed between the first well region of the first conductivity type and the first dummy gate of the second conductivity type, the first well region formed in the first redundant area of the substrate, the first dummy gate formed on the first well region, the first well region serving as a negative plate of the first capacitor, the first dummy gate serving as a positive plate of the first capacitor, the second capacitor formed in the second redundant area, the second capacitor comprising a second well region of the first conductivity type, a third well region of the second conductivity type, a second dummy gate of the first conductivity type and a second gate dielectric layer formed between the third well region of the second conductivity type and the second dummy gate of the first conductivity type, the second well region formed in the second redundant area of the substrate, the third well region formed in the second well region, the second dummy gate formed on the third well region, the third well region serving as a positive plate of the second capacitor, the second dummy gate serving as a negative plate of the second capacitor;
   forming a first doped region and a second doped region of the first conductivity type, the first doped region is formed in the first well region and the second doped region is formed in the second well region;
   forming a third doped region of the second conductivity type in the third well region; and
   forming contact plugs, the contact plugs comprising a first contact plug, a second contact plug, a third contact plug, a fourth contact plug and a fifth contact plug, the first contact plug aligned with the first doped region, the second contact plug aligned with the second doped region, the third contact plug aligned with the third doped region, the fourth contact plug is formed on the first dummy gate and the fifth contact plug is formed on the second dummy gate, the first contact plug, the second contact plug, the third contact plug, the fourth contact plug and the fifth contact plug are all made of tungsten, and a shallow trench isolation (STI) structure, the STI structure has a top surface flush with a bottom surface of the first dummy gate and the second dummy gate, extends through the first gate dielectric layer and the second gate dielectric layer into the first well region and the second well region so as to define a virtual active area in the substrate, wherein the top surface of the STI structure is in direct connection with the bottom surface of the first dummy gate and the second dummy gate, and the first dummy gate and the second dummy gate are not in contact with each other, wherein the first conductivity type is n-type and the second conductivity type is p-type, the first dummy gate is made of p+ doped polysilicon and the second dummy gate is made of n+ doped polysilicon; the positive plate of the first capacitor and the positive plate of the second capacitor are configured for connection with a positive voltage rail and the negative plate of the first capacitor and the negative plate of the second capacitor are configured for connection with a negative voltage rail.

3. The method of forming a semiconductor device structure of claim 2, wherein both the first well region and the second well regions are formed by using a first ion implantation process, the first ion implantation process is performed by implanting ions of the first conductivity type at a concentration of from $1E15/cm^2$ to $15E15/cm^2$.

4. The method of forming a semiconductor device structure of claim 3, wherein the third well region is formed by using a second ion implantation process, the second ion implantation process is performed by implanting ions of the second conductivity type at a concentration of from $1E15/cm^2$ to $15E15/cm^2$.

5. The semiconductor device structure of claim 1, wherein the first doped region and the negative plate of the first capacitor are connected to the negative voltage rail through the first contact plug.

6. The semiconductor device structure of claim 1, wherein the second doped region and the second well region are connected to the negative voltage rail through the second contact plug.

7. The semiconductor device structure of claim 1, wherein the third doped region and the positive plate of the second capacitor are connected to the positive voltage rail through the third contact plug.

8. The semiconductor device structure of claim 1, wherein the first dummy gate is connected to the positive voltage rail through the fourth contact plug.

9. The semiconductor device structure of claim 1, wherein the second dummy gate is connected to the negative voltage rail through the fifth contact plug.

10. The semiconductor device structure of claim 1, wherein the first dummy gate is electrically connected to an external circuit through the fourth contact plug and the second dummy gate is electrically connected to the external circuit through the fifth contact plug.

11. The method of forming a semiconductor device structure of claim 2, wherein the first dummy gate is electrically connected to an external circuit through the fourth contact plug and the second dummy gate is electrically connected to the external circuit through the fifth contact plug.

* * * * *